(12) United States Patent
Dirks et al.

(10) Patent No.: US 8,219,959 B2
(45) Date of Patent: Jul. 10, 2012

(54) GENERATING INTEGRATED CIRCUIT FLOORPLAN LAYOUTS

(75) Inventors: Juergen Dirks, Holzkirchen (DE); Norbert Mueller, Munich (DE); Stefan Block, Munich (DE)

(73) Assignee: LSI Corporation, Milpitas, CA (US)

( * ) Notice: Subject to any disclaimer, the term of this patent is extended or adjusted under 35 U.S.C. 154(b) by 368 days.

(21) Appl. No.: 12/508,898

(22) Filed: Jul. 24, 2009

(65) Prior Publication Data

US 2011/0023000 A1    Jan. 27, 2011

(51) Int. Cl.
*G06F 17/50* (2006.01)
*G06F 9/455* (2006.01)

(52) U.S. Cl. ........ 716/124; 716/118; 716/119; 716/125; 716/131

(58) Field of Classification Search .......... 716/118–126, 716/129–131
See application file for complete search history.

(56) References Cited

U.S. PATENT DOCUMENTS

| | | | | |
|---|---|---|---|---|
| 4,630,219 A * | 12/1986 | DiGiacomo et al. | ......... | 716/123 |
| 4,870,598 A * | 9/1989 | Shaw et al. | ................... | 716/116 |
| 5,483,461 A | 1/1996 | Lee et al. | ....................... | 716/119 |
| 5,822,214 A * | 10/1998 | Rostoker et al. | .............. | 716/123 |
| 5,838,583 A * | 11/1998 | Varadarajan et al. | ......... | 716/123 |
| 6,449,761 B1 * | 9/2002 | Greidinger et al. | ........... | 716/122 |
| 6,901,571 B1 | 5/2005 | Petranovic et al. | | |
| 6,961,916 B2 | 11/2005 | Sarrafzadeh et al. | | |
| 7,076,755 B2 | 7/2006 | Ren et al. | | |
| 7,127,695 B2 | 10/2006 | Huang et al. | | |
| 7,962,884 B2 * | 6/2011 | Ishikawa | ....................... | 716/135 |
| 2002/0087939 A1 * | 7/2002 | Greidinger et al. | .............. | 716/2 |
| 2003/0233625 A1 * | 12/2003 | Brazell et al. | ..................... | 716/8 |
| 2005/0155006 A1 * | 7/2005 | Subasic et al. | ................... | 716/10 |
| 2005/0268269 A1 * | 12/2005 | Coiley | ............................ | 716/11 |
| 2006/0117288 A1 * | 6/2006 | Katagiri | ............................ | 716/8 |
| 2006/0265678 A1 * | 11/2006 | Okabe | .............................. | 716/6 |
| 2008/0244490 A1 * | 10/2008 | Nakatake et al. | ................. | 716/9 |
| 2009/0031269 A1 * | 1/2009 | Chen et al. | ......................... | 716/9 |
| 2009/0113368 A1 * | 4/2009 | Lin et al. | .......................... | 716/10 |
| 2009/0113370 A1 * | 4/2009 | Yoshinaga | ....................... | 716/11 |
| 2009/0199142 A1 * | 8/2009 | Arunachalam et al. | ........... | 716/5 |
| 2009/0217228 A1 * | 8/2009 | Melzner | ........................... | 716/10 |
| 2009/0313594 A1 * | 12/2009 | Arunachalam | ..................... | 716/9 |

* cited by examiner

*Primary Examiner* — Stacy Whitmore
(74) *Attorney, Agent, or Firm* — Mendelsohn, Drucker & Associates, P.C.

(57) ABSTRACT

A method of generating a floorplan layout of an integrated circuit (IC) that is amenable to implementation in a computer-aided design tool. The method is capable of performing placement and routing processing for the IC while requiring very little information about the specific circuitry used in various functional blocks of the IC. For example, at the time of the placement and routing processing, one or more functional blocks of the IC can be specified as empty functional blocks and/or functional blocks that are only partially rendered in gates.

17 Claims, 5 Drawing Sheets

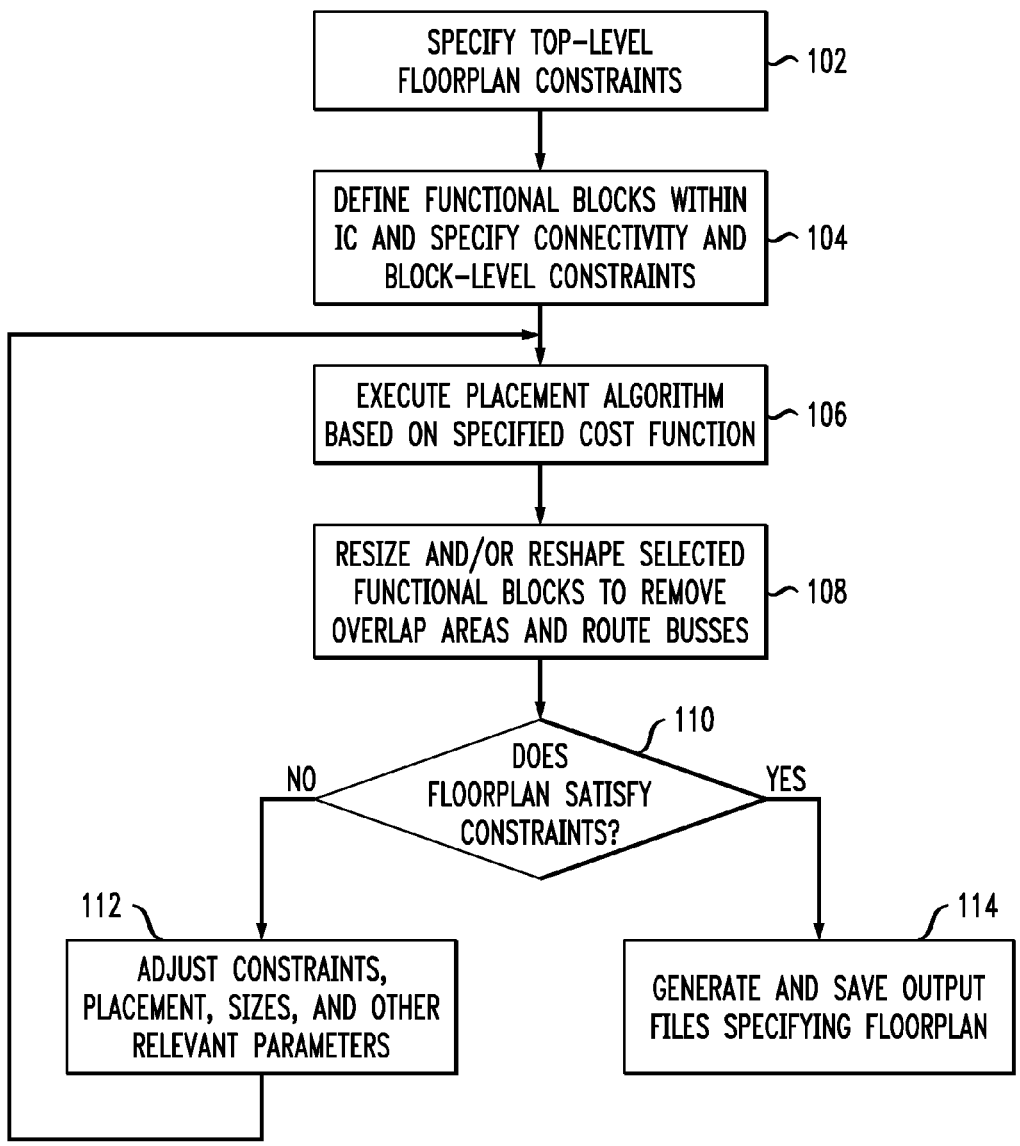

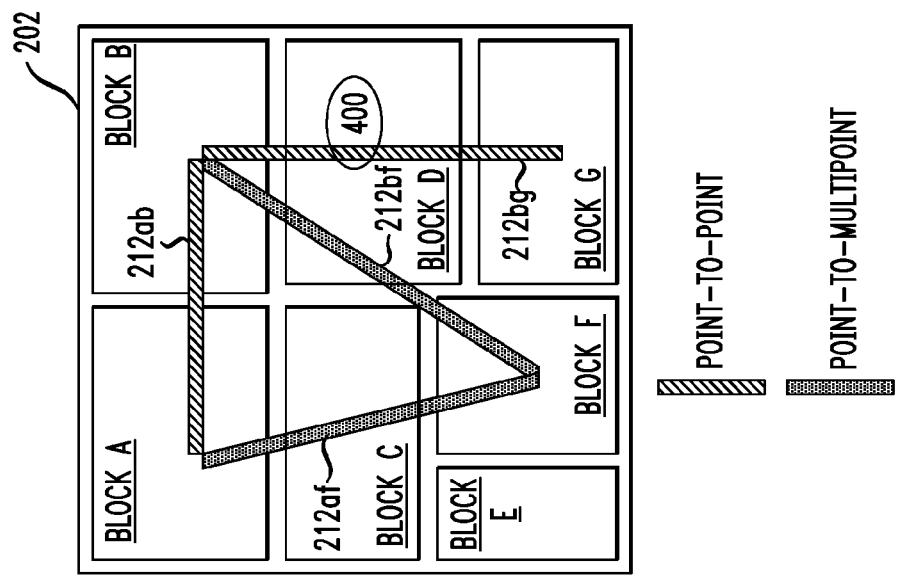
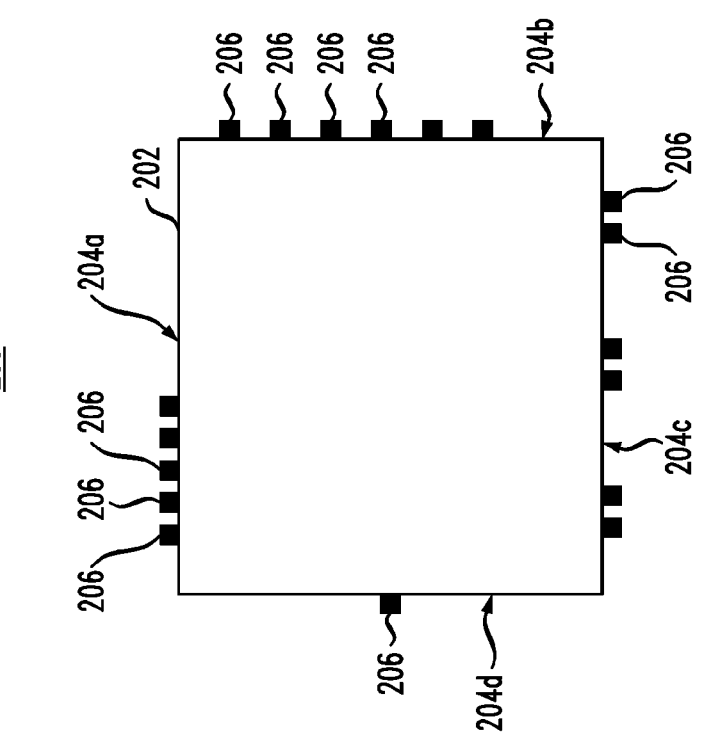

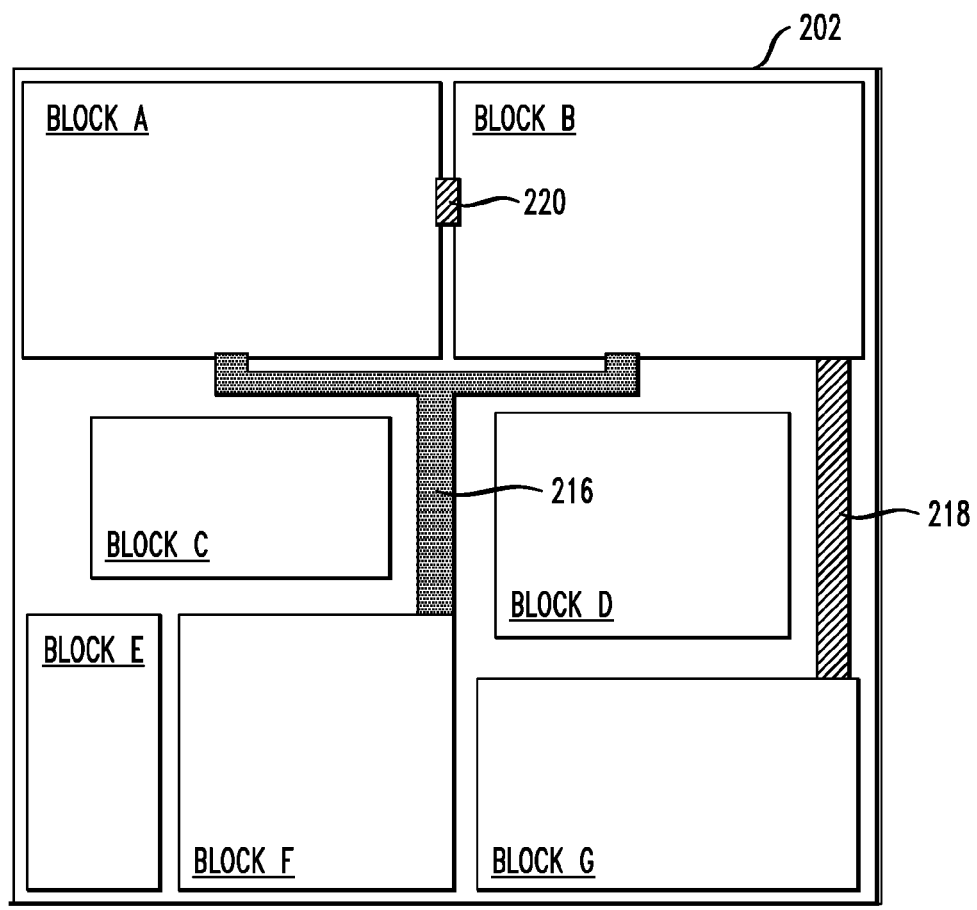

300

GENERATING INTEGRATED CIRCUIT FLOORPLAN LAYOUTS

BACKGROUND

1. Field of the Invention

The present invention relates generally to the design and fabrication of integrated circuits (ICs) and, more specifically but not exclusively, to computer-aided design (CAD) tools for generating IC layouts.

2. Description of the Related Art

This section introduces aspects that may help facilitate a better understanding of the invention(s). Accordingly, the statements of this section are to be read in this light and are not to be understood as admissions about what is in the prior art or what is not in the prior art.

An IC layout is a representation of an integrated circuit in terms of planar geometric shapes corresponding to various sub-circuits, such as functional blocks, interfaces, and/or individual circuit elements. Since the behavior and performance of an IC depends on the positions of and interconnections between its sub-circuits, a layout engineer aims to place and connect the sub-circuits on a chip so that certain criteria specifying, e.g., performance characteristics, manufacturability parameters, and geometric size are met. An IC layout is usually subjected to various verification procedures, with the two most-commonly used being the Design Rule Checking (DRC) and Layout Versus Schematic (LVS) analyses. After the layout is verified, it is translated into a suitable standard format, and the resulting files are then sent to a semiconductor foundry for fabricating the IC.

For relatively large ICs, e.g., having millions of gates, the process of producing a suitable IC layout involves analyzing many possible floorplans. With the CAD tools that are currently available on the market, this process can be relatively time consuming and cumbersome because it involves many manual tasks. For example, during early design phases, when gate-level netlists are not yet reasonably complete, a layout engineer might be forced to manually define black-box shapes in lieu of the missing netlists. Furthermore, most prior-art floor-planning tools do not work for pure register-transfer-level (RTL) descriptions, which disadvantageously prevents users from performing a floorplan analysis early in the design process.

SUMMARY

Disclosed herein are various embodiments of a method of generating a floorplan layout of an integrated circuit (IC) that is amenable to implementation in a computer-aided design (CAD) tool. The method is capable of performing placement and routing processing for the IC while requiring very little information about the specific circuitry used in various functional blocks of the IC. For example, at the time of the placement and routing processing, one or more functional blocks of the IC can be specified as empty functional blocks and/or functional blocks that are only partially rendered in gates. Advantageously over the prior art, a CAD tool employing this method can automatically create a routed, block-structured floorplan with functional blocks having optimal sizes, shapes, and locations according to user-specified attributes, characteristics, and goals at any level of design completeness, thereby facilitating efficient floorplanning during very early stages of the IC-design process.

According to one embodiment, provided is a computer-implemented method of designing an IC having the steps of: (A) defining a plurality of functional blocks for the IC, wherein at least one functional block of said plurality is an empty functional block or a functional block that is only partially rendered in circuit elements; (B) specifying connectivity and one or more constraints for said plurality of functional blocks; and (C) performing placement and routing processing for said plurality of functional blocks based on the specified connectivity and the specified one or more constraints to generate a layout for the IC.

According to another embodiment, provided is a machine-readable medium, having encoded thereon program code, wherein, when the program code is executed by a machine, the machine implements the above-specified method of designing an IC.

According to yet another embodiment, provided is a physical embodiment of the IC designed using the above-specified method.

BRIEF DESCRIPTION OF THE DRAWINGS

Other aspects, features, and benefits of various embodiments of the invention will become more fully apparent, by way of example, from the following detailed description and the accompanying drawings, in which:

FIG. 1 shows a flowchart of a method of generating IC layouts according to one embodiment of the invention;

FIGS. 2A-E show a series of representative IC layouts generated at different steps of the method shown in FIG. 1.

DETAILED DESCRIPTION

Figure 2D:
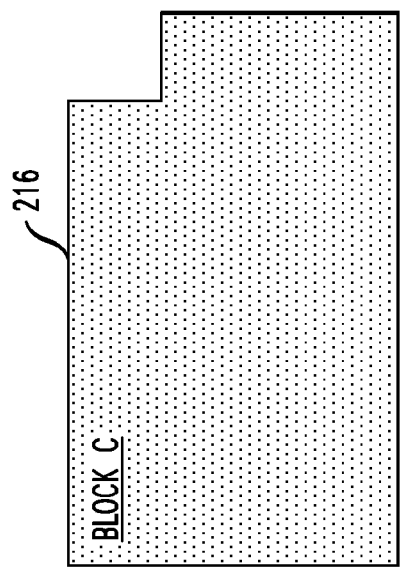

FIGS. 1 and 2A-E illustrate a method 100 of generating IC layouts according to one embodiment of the invention. More specifically, FIG. 1 shows a flowchart of method 100. FIGS. 2A-E show representative IC layouts corresponding to different steps of method 100. In general, method 100 is amenable to being implemented as part of a software package or suite for computer-aided design (CAD) of ICs.

Referring to FIG. 1, at step 102 of method 100, top-level floorplan constraints are specified. Top-level floorplan constraints may include, but are not limited to, (i) an upper limit on the area occupied by the IC; (ii) an aspect ratio of a boundary box corresponding to the IC; and (iii) pin locations on the perimeter of the IC. The top-level floorplan constraints can be specified by the user through a CAD interface or read from a corresponding input file.

FIG. 2A schematically shows an example of the top-level floorplan constraints corresponding to step 102. More specifically, an IC 200 shown in FIG. 2A is characterized by a square boundary box 202 (i.e., a boundary box having an aspect ratio of 1:1). A first side 204a of boundary box 202 has five pins 206 relatively closely clustered together near a corner of the boundary box. A second side 204b of boundary box 202 has six pins 206 relatively uniformly distributed along the length of that side. A third side 204c of boundary box 202 has six pins 206 arranged in three pairs. A fourth side 204d of boundary box 202 has one pin 206 located near the middle of that side.

Referring back to FIG. 1, at step 104 of method 100, a design description defining a plurality of functional blocks and specifying their connectivity within the IC is provided by the user and/or read from a corresponding input file. Note that step 104 does not require detailed information about the number and/or type of the logic gates and other circuit elements inside each of the functional blocks. For example, step 104 enables the user to specify the size of an empty functional block and an estimated gatecount for that block. As used herein, the term "empty functional block" refers to a functional block whose circuit function within the IC has been defined, but whose specific content in terms of gates and/or other circuit elements has not yet been developed.

If a particular functional block is partially available in gates/circuit elements, then the user can specify an approximate percentage of the gates/circuit elements that are missing. From this information, the CAD tool running method 100 might determine a minimum possible area that can be allocated to the functional block and then use the determined minimum area as a constraint for the overall floorplan. Additional constraints for the floorplan can be generated if more information is available about various functional blocks. For example, some functional blocks might have specific aspect ratios assigned to them.

In general, the constraints specified at step 104 might be very few, e.g., just the lower bound on the area for functional blocks of each type, or very many, e.g., an estimated number of cells in each functional block, the upper bound on the area for functional blocks of each type, aspect ratio ranges, locations of internal (to the IC) pins corresponding to interconnections between various functional blocks, restrictions on functional-block locations inside the boundary box (e.g., inside boundary box 202 of FIG. 2A), etc. For multiple instances of the same functional block, the constraints specified at step 104 might state whether each instance of the functional block should be treated separately or together with other instances of that functional block. In the former case, different instances of the same functional block might be represented by differently shaped macros in the final layout of the IC. In contrast, in the latter case, different instances of the same functional block will be represented by substantially identical macros.

At step 106, the CAD tool running method 100 executes a placement algorithm that takes into account the information and/or constraints provided at steps 102 and 104. More specifically, based on a specified cost function, various functional blocks are (re)arranged inside a boundary box (e.g., boundary box 202 of FIG. 2) while being treated as rubber boxes. A rubber box is a planar expandable and/or compressible object of a specified (e.g., rectangular or polygonal) shape. During the placement processing of step 106, the position, shape, boundary length, and/or aspect ratio of each rubber box can be changed as appropriate or necessary as long as the area of each rubber box remains within the assigned range defined by the corresponding lower and upper bounds.

The cost function is used at step 106 to determine optimal positions for various functional blocks. More specifically, the cost function is calculated using weighted parameters that depend on the positions and other relevant characteristics of the functional blocks. For example, one parameter that might be used is the total area taken up by the functional blocks. Another possible parameter might be related to distances between different functional blocks and/or the corresponding net lengths. Parameter specifications might have different granularity, e.g., from a global setting (e.g., overall area or overall timing) to a specific setting (e.g., the length of a critical-signal net).

In general, the cost function used at step 106 can be constructed by the user based on desired characteristics of the final IC layout or selected from a library of available preprogrammed cost functions. For example, a cost function can be constructed to perform one or more of the following: (i) to minimize the overall chip area for the IC; (ii) to minimize the chip area for one or more selected functional blocks; (iii) to minimize the wireline length for the longest wireline; and (iv) to minimize the average wireline length between functional blocks. Representative cost functions that can be used at step 106 are disclosed, e.g., in U.S. Pat. Nos. 7,127,695, 7,076, 755, 6,961,916, and 6,901,571, all of which are incorporated herein by reference in their entirety.

FIG. 2B schematically shows an example of the top-level floorplan corresponding to step 106. More specifically, FIG. 2B depicts IC 200 as having seven functional blocks: Block A, Block B, . . . , Block G. Pins 206 (see FIG. 2A) are omitted in FIG. 2B for clarity.

In one embodiment of method 100, the placement algorithm of step 106 uses a block-connectivity model according to which all wireline connections between (i) individual functional blocks of IC 200 and (ii) an individual functional block of the IC and a corresponding pin 206 originate in the middle (e.g., near the geometric center) of the functional block. FIG. 2B illustratively shows four flylines 212 representing wireline connections between different functional blocks of IC 200. More specifically, flyline 212*ab* represents wireline connections between Block A and Block B. Flyline 212*af* represents wireline connections between Block A and Block F. Flyline 212*bf* represents wireline connections between Block B and Block F. Flyline 212*bg* represents wireline connections between Block B and Block G.

Each flyline 212 might correspond to a single wireline connection or multiple wireline connections. In a representative embodiment, the CAD tool running method 100 might use color coding in a graphical user interface (GUI) to indicate to the user the type of wireline connection, e.g., point-to-point or point-to-multipoint. For example, in FIG. 2B, flylines 212*ab* and 212*bg* are indicated as point-to-point connections. In contrast, flylines 212*af* and 212*bf* are indicated as point-to-multipoint connections. The CAD tool might also display, next to each flyline 212, the number of signals corresponding to that flyline. For example, FIG. 2B indicates that flyline 212*bg* has four hundred signals.

In one embodiment, the placement algorithm of step 106 might treat flylines 212 as rubber bands that are stretched and reoriented when various functional blocks are being moved inside boundary box 202. If step 106 uses a cost function that seeks to minimize the average wireline length, then the "tension" of each rubber band can qualitatively be viewed as a measure of the contribution of each particular flyline 212 into the cost function. One skilled in the art will appreciate that, using said cost function, the placement algorithm of step 106 will effectively seek to minimize the cumulative tension of the rubber bands by appropriately moving various functional blocks inside boundary box 202. An exemplary final result of the functional-block rearrangement effected at step 106 might look like the layout shown in FIG. 2B.

Figure 2C:
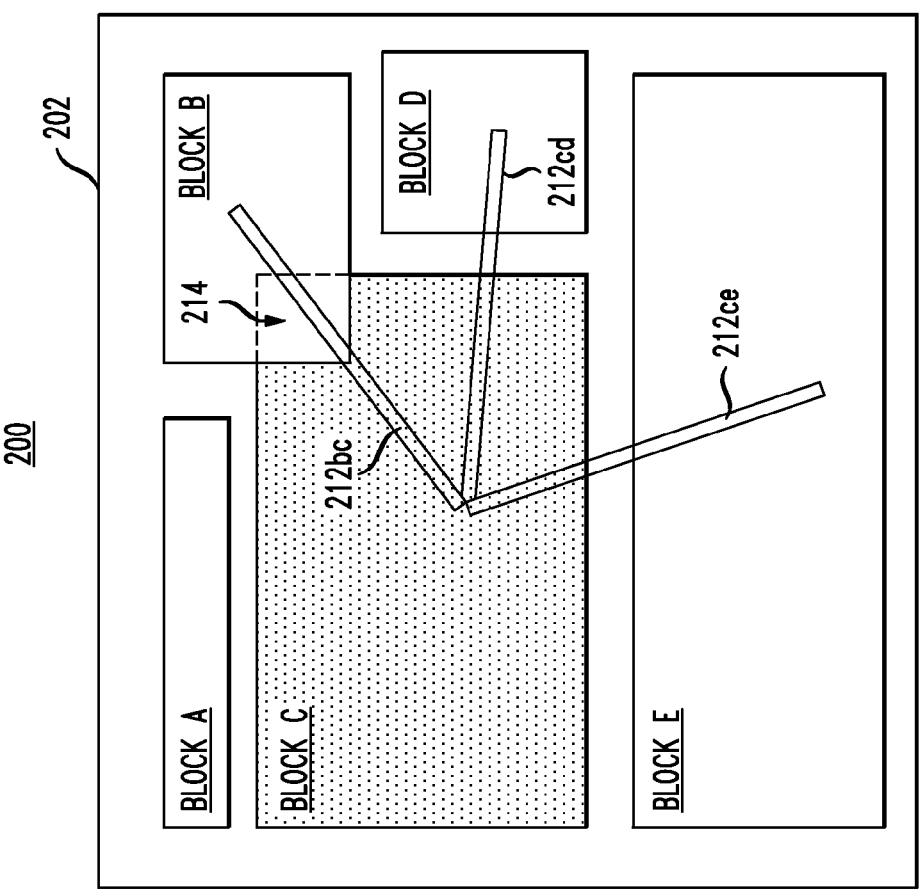

FIG. 2C schematically shows another example of the top-level floorplan corresponding to step 106. More specifically, FIG. 2C depicts IC 200 as having five functional blocks: Block A, Block B, . . . , Block E. Three flylines (i.e., flylines 212*bc*, 212*cd*, and 212*ce*) are shown. Pins 206 (see FIG. 2A) are omitted in FIG. 2C for clarity.

The layout shown in FIG. 2C differs from the layout shown in FIG. 2B in that two functional blocks (Block B and Block C) have an overlap area 214. In general, the CAD tool running method 100 might enable the user to specify (i) whether the placement algorithm of step 106 can partially overlap functional blocks while moving them around and (ii) the maximum permissible amount of overlap, either in absolute area units or in percentage points. If overlap is prohibited, then a typical layout produced at step 106 might be similar to that shown in FIG. 2B. However, if overlap is permitted, then a representative layout produced at step 106 might have one or more overlap areas analogous to overlap area 214 shown in FIG. 2C.

Referring back to FIG. 1, at step 108 of method 100, some or all functional blocks of IC 200 might be resized and/or reshaped as further described below. The resizing/reshaping performed during step 108 has at least two purposes: (1) to remove possible overlap areas, such as overlap area 214 shown in FIG. 2C, and (2) to create routing spaces between the functional blocks to accommodate various busses and/or wirelines corresponding to flylines 212 (see FIGS. 2B-C).

FIG. 2D schematically shows how Block C of FIG. 2C can be reshaped during step 108 to remove overlap area 214. As already mentioned above, method 100 can operate not only with rectangular shapes, but with rectilinear shapes as well. As FIG. 2D indicates, the previously rectangular Block C is transformed during step 108 into a rectilinear shape 216 by deducting the area corresponding to overlap area 214 from the rectangular Block C. Note that Block B that overlapped with Block C in FIG. 2C remains unchanged. Further details on the removal of overlap areas during step 108 are provided below in reference to FIG. 3.

FIG. 2E schematically shows how the layout of IC 200 shown in FIG. 2B can be modified during step 108 to create routing spaces for busses and/or wirelines corresponding to flylines 212. From the comparison of FIGS. 2E and 2B, it is apparent that, during step 108, both Block C and Block D of FIG. 2B have been reduced in size. This size reduction created inter-block spaces that have been used for routing busses 216 and 218 as indicated in FIG. 2E. Bus 216, which corresponds to flylines 212*af* and 212*bf*, has been routed to connect Block F with Blocks A and B. Similarly, bus 218, which corresponds to flyline 212*bg*, has been routed to connect Block B and Block G. Note that the topology of IC 200 shown in FIG. 2B enabled the insertion and routing of bus 220 (corresponding to flyline 212*ab*) without resizing or reshaping Blocks A and B.

Referring again to FIG. 1, at step 110 of method 100, a verification procedure is run to determine whether the block-structured floorplan produced at step 108 satisfies the constraints specified at step 104 and/or any additional constraints applicable to the IC. If the block-structured floorplan is within the constraints, then the processing of method 100 is directed to step 114 where one or more output files that describe all relevant characteristics of the floorplan are generated by the CAD tool and saved for further use in subsequent IC-design procedures. If the block-structured floorplan is not within the constraints, then the processing of method 100 is directed to step 112.

At step 112, the constraints can be adjusted as appropriate or necessary to enable method 100 to converge on a usable block-structured floorplan during a next iteration. In addition, the placement, sizes, and other relevant parameters of the functional blocks can be adjusted to further facilitate the convergence and/or to take into account any additional considerations that the user might have after the last execution of steps 106-110. After step 112, the processing of method 100 is directed back to step 106.

In general, a CAD tool running method 100 enables the user to inspect the results at each step of the method and save them in a desired format. For example, the CAD tool might be configured to generate a description of various components that might be required as inputs for any subsequent block-level work, including the work performed using other CAD tools. Such description might include block sizes, block shapes, internal pin locations for various blocks, and parameters of block and/or pin metal layers, all specified in a selected standard format (e.g., the Design Exchange Format, DEF). The CAD tool further enables the user to interactively change, e.g., using a GUI, one or more parameters for various components of the current IC layout and then restart method 100 using the modified IC layout as a new starting point. Alternatively or in addition, the CAD tool might enable the user to locally restart method 100 at any processing step while using the modified IC layout as a starting point for that particular step.

Advantageously over the prior-art CAD tools, a CAD tool running method 100 can automatically create a block-structured floorplan with functional blocks having optimal sizes, shapes, and locations according to user-specified attributes, characteristics, and goals at any level of design completeness (e.g., RTL, netlists, and any combinations thereof). In particular, no complete design netlists are needed because method 100 enables the CAD tool to generate a usable block-structured floorplan with very little input information on the functional blocks and/or very few constraints imposed on the IC. As a result, efficient floorplanning work can be performed very early in the design process. The block-structured floorplans generated with method 100 can be reused at any floor-planning stage and are amenable to being imported into other CAD tools without manual modifications. The automation afforded by method 100 advantageously saves significant amounts of engineering time, leads to better results, and reduces design turnaround times.

Figure 3:
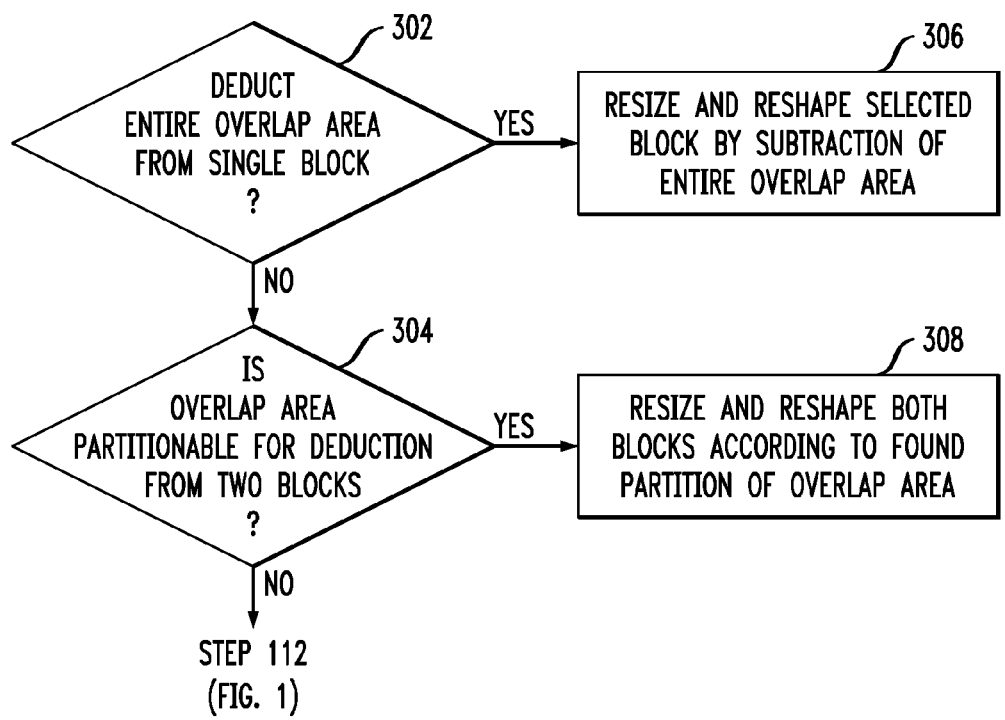
FIG. 3 shows a flowchart of a method of removing overlap areas that can be used in the method of FIG. 1 according to one embodiment of the invention.

FIG. 3 shows a method 300 of removing an overlap area that can be used at step 108 of method 100 according to one embodiment of the invention. Depending on the specific situation, method 300 can produce two qualitatively different outcomes. In one outcome, the entire overlap area is deducted from a selected one of the two functional blocks that produce the overlap. The removal of overlap area 214 illustrated by FIGS. 2C-D shows this outcome. In an alternative outcome, part of the overlap area is deducted from one functional block while the remainder of the overlap area is deducted from the other functional block. In general, the constraints specified at steps 102, 104, and/or 112 of method 100 can cause method 300 to produce a particular one of these two outcomes.

At step 302 of method 300, it is determined whether the entire overlap area can be deducted from a single functional block. More specifically, each of the two functional blocks that produce the overlap is provisionally reshaped and resized by subtracting from the functional block the entire overlap area. Then, the resulting block shape is subjected to a verification procedure to determine whether it satisfies all relevant constraints (e.g., some or all of the constraints specified at steps 102, 104, and/or 112 of method 100). If the verification fails for both shapes, then the processing of method 300 is directed to step 304. If the verification is successful for at least one of the shapes, then the processing of method 300 is directed to step 306.

At step 304, it is determined whether the overlap area can be partitioned for being deducted from two functional blocks. More specifically, a provisional division line is drawn through the overlap area to divide it into two portions. The first portion is then provisionally subtracted from one of the functional blocks, while the second portion is provisionally subtracted from the other functional block. Then, each of the resulting block shapes is subjected to a verification procedure to determine whether the functional block satisfies all relevant constraints (e.g., some or all of the constraints specified at steps 102, 104, and/or 112 of method 100). If the verification fails for at least one of the shapes, then the division line is adjusted and the evaluation is repeated until the verification is successful for both of the shapes. Thereafter, the processing of method 300 is directed to step 308, where the corresponding functional blocks are reshaped and resized according to the last partition line. If a suitable partition of the overlap area is not found after a specified number of iterations, then the processing of method 300 is terminated, e.g., to make appropriate adjustments to the floorplan and/or constraints. These adjustments can be implemented, e.g., using step 112 of method 100.

At step 306, a selected one of the two functional blocks is resized and reshaped by subtracting from it the entire overlap area. If the verification procedure of step 302 is successful for only one of the block shapes, then the corresponding functional block is selected for being reshaped/resized in step 306. If the verification procedure of step 302 is successful for both of the shapes, then additional criteria are used to select one of them for reshaping and resizing. Such additional criteria can be based on, e.g., the relative size of the functional blocks, the positions of the functional blocks within the boundary box, and/or the completeness of the specific circuit designs for the functional blocks. Alternatively, the user can manually select a desired functional block for reshaping and resizing in step 306.

One skilled in the art will appreciate that method 300 can successively be applied to each of possible multiple overlap areas in temporary block-structured floorplans generated during steps 106 and 108 of method 100 to remove all of said overlap areas.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. The use of terms such as height, length, width, top, bottom, is strictly to facilitate the description of the invention and is not intended to limit the invention to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

What is claimed is:

1. A method of designing an integrated circuit (IC), the method comprising:
   (A) defining a plurality of functional blocks for the IC, wherein at least one functional block of said plurality is an empty functional block;
   (B) specifying connectivity and one or more constraints for said plurality of functional blocks; and
   (C) performing placement and routing processing for said plurality of functional blocks based on the specified connectivity and the specified one or more constraints to generate a layout for the IC, wherein:
   said placement and routing processing comprises at least one of:
      moving an empty functional block of said plurality within a boundary box corresponding to the IC; and
      changing at least one of shape, boundary length, and aspect ratio of an empty functional block of said plurality; and
   wherein, the method is implemented using an apparatus configured to run a computer-aided design tool.

2. The method of claim 1, wherein said plurality of functional blocks is a plurality of empty functional blocks.

3. The method of claim 1, wherein step (C) comprises performing the placement and routing processing based on a cost function.

4. The method of claim 3, wherein step (C) further comprises:
   (C1) constructing the cost function based on one or more desired characteristics of the IC; or
   (C2) selecting the cost function from a library of available cost functions.

5. The method of claim 1, wherein step (C) comprises:
(C1) generating a temporary floorplan, wherein a first functional block overlaps with a second functional block to produce an overlap area.

6. The method of claim 5, wherein said one or more constraints comprise a maximum permissible amount of overlap between functional blocks during the placement and routing processing.

7. The method of claim 5, wherein step (C) further comprises:
(C2) at least one of reshaping and resizing at least one of the first and second functional blocks to remove the overlap area.

8. The method of claim 7, wherein step (C2) comprises:
partitioning the overlap area into first and second portions;
subtracting the first portion from the first functional block; and
subtracting the second portion from the second functional block.

9. The method of claim 1, further comprising:
(D) at least one of reshaping and resizing at least one functional block of the plurality to create space for one or more busses that implement said connectivity; and
(E) inserting said one or more busses using the created space to generate a routed, block-structured floorplan.

10. The method of claim 9, further comprising:
(F) determining whether the routed, block-structured floorplan satisfies said one or more constraints; and
(G) if the routed block-structured floorplan satisfies said one or more constraints, then generating and saving one or more output files that describe the routed, block-structured floorplan.

11. The method of claim 10, further comprising:
(H) if the routed, block-structured floorplan does not satisfy said one or more constraints, then changing at least one parameter selected from a group of parameters consisting of (i) said one or more constraints and (ii) at least one of position, shape, boundary length, and aspect ratio for at least one functional block in the routed, block-structured floorplan; and
(I) repeating steps (C) through (G) using the changes effected in step (H).

12. The method of claim 1, wherein:
in step (A), the plurality of functional blocks is defined using a pure register-transfer-level (RTL) description without a description of netlists; and
the layout is generated based on said pure RTL description.

13. The method of claim 1, further comprising saving the layout of the IC in a non-transitory machine-readable medium.

14. The method of claim 1, further comprising displaying the layout of the IC on a screen.

15. The method of claim 1, further comprising fabricating a physical embodiment of the IC based on the layout, said physical embodiment comprising circuits corresponding to said plurality of functional blocks and electrically connected in accordance with the specified connectivity.

16. A non-transitory machine-readable medium, having encoded thereon program code, wherein, when the program code is executed by the apparatus, the apparatus implements the method of claim 1.

17. The method of claim 1, wherein an empty functional block of said plurality is a functional block whose circuit function within the IC is defined, but whose specific content in terms of circuit elements is not yet developed.

* * * * *